(12) United States Patent
Charpin-Nicolle et al.

(10) Patent No.: US 8,865,548 B2
(45) Date of Patent: Oct. 21, 2014

(54) METHOD OF MAKING A NON-VOLATILE DOUBLE GATE MEMORY CELL

(71) Applicant: Commissariat a l'Energie Atomique et aux Ene Alt, Paris (FR)

(72) Inventors: Christelle Charpin-Nicolle, Fontanil-Cornillon (FR); Eric Jalaguier, Saint Martin d'Uriage (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 39 days.

(21) Appl. No.: 13/736,524

(22) Filed: Jan. 8, 2013

(65) Prior Publication Data

US 2013/0187213 A1 Jul. 25, 2013

(30) Foreign Application Priority Data

Jan. 9, 2012 (FR) ..................... 12 50203

(51) Int. Cl.
| | |
|---|---|
| H01L 21/336 | (2006.01) |
| H01L 29/423 | (2006.01) |
| H01L 29/78 | (2006.01) |
| H01L 21/28 | (2006.01) |
| H01L 29/66 | (2006.01) |
| H01L 29/792 | (2006.01) |

(52) U.S. Cl.
CPC ...... *H01L 29/66484* (2013.01); *H01L 29/4234* (2013.01); *H01L 29/7831* (2013.01); *H01L 21/28282* (2013.01); *H01L 29/66833* (2013.01); *H01L 29/792* (2013.01)
USPC .................... 438/267; 257/316; 257/E21.682

(58) Field of Classification Search
USPC .......................... 438/265, 267, 596; 257/320
See application file for complete search history.

(56) References Cited

U.S. PATENT DOCUMENTS

| | | | |
|---|---|---|---|
| 2,381,471 | A | 8/1945 | Teter |
| 4,868,929 | A | 9/1989 | Curcio |

(Continued)

FOREIGN PATENT DOCUMENTS

| | | |
|---|---|---|
| EP | 2 381 471 A1 | 10/2011 |
| FR | 10 53076 | 4/2010 |
| FR | 10 60023 | 12/2010 |
| JP | 2011-187562 | 9/2011 |

OTHER PUBLICATIONS

Sohrab Kianian, et al., "A novel 3 volts-only, small sector erase, high density flash E²PROM", Symposium on VLSI Technology Digest of Technical Papers, 6A.4, 1994, pp. 71-72.

(Continued)

*Primary Examiner* — Chandra Chaudhari
(74) *Attorney, Agent, or Firm* — Oblon, Spivak, McClelland, Maier & Neustadt, L.L.P.

(57) ABSTRACT

A method of making a non-volatile double-gate memory cell. The gate of the control transistor is formed with a relief of a semiconductor material on a substrate. The control gate of the memory transistor is formed with a sidewall of the relief of a semiconductor material configured to store electrical charge. A first layer is deposited so as to cover the stack of layers. The first layer is etched so as to form a first pattern juxtaposed on the relief. A second layer is formed on the first pattern. The second layer is etched so as to form on the first pattern a second pattern having a substantially plane upper face.

24 Claims, 6 Drawing Sheets

(56) References Cited

U.S. PATENT DOCUMENTS

| | | | |
|---|---|---|---|
| 5,408,115 A * | 4/1995 | Chang | 257/324 |
| 5,768,192 A | 6/1998 | Eitan | |
| 6,773,993 B2 * | 8/2004 | Lin et al. | 438/267 |
| 6,803,620 B2 * | 10/2004 | Moriya et al. | 257/298 |
| 7,130,223 B2 | 10/2006 | Ishimaru et al. | |
| 8,252,702 B2 | 8/2012 | Molas et al. | |
| 2004/0155234 A1 | 8/2004 | Ishimaru et al. | |
| 2004/0207025 A1 | 10/2004 | Chiba et al. | |
| 2005/0121715 A1 | 6/2005 | Jeng | |
| 2006/0050557 A1 | 3/2006 | Ishimaru et al. | |
| 2007/0228498 A1 | 10/2007 | Toba et al. | |
| 2010/0078706 A1 | 4/2010 | Matsuda | |
| 2010/0264479 A1 | 10/2010 | Toba et al. | |
| 2011/0300699 A1 | 12/2011 | Molas et al. | |
| 2012/0139025 A1 | 6/2012 | Gely et al. | |

OTHER PUBLICATIONS

French Preliminary Search Report and Written Opinion issued Aug. 28, 2012, in French 1250203, filed Jan. 9, 2012 (with English Translation of Categories of Cited Documents).

U.S. Appl. No. 13/736,578, filed Jan. 8, 2013, Charpin-Nicolle.

* cited by examiner

PRIOR ART

METHOD OF MAKING A NON-VOLATILE DOUBLE GATE MEMORY CELL

TECHNICAL FIELD OF THE INVENTION

The invention relates to the field of electronic memory devices or memories of non-volatile type. It has particularly advantageous application in the field of electronic memories of double-gate flash type comprising a control gate, also referred to as gate of the control transistor, and a memory gate, also referred to as control gate of the memory transistor.

PRIOR ART

There exist several types of non-volatile memories, in other words memories that preserve stored information in the absence of electrical supply and can be written and/or erased electrically:

EPROMS, for the English "Erasable Programmable Read Only Memories", in other words "erasable and programmable (read only) permanent memories", the contents of which may be written electrically but which must be subjected to ultraviolet (UV) radiation to erase the information stored therein.

EEPROMS, for the English "Electrically Erasable Programmable ROMs", in other words "electrically erasable and programmable permanent memories", the contents of which may be written and erased electrically but which require larger semiconductor surfaces for their production than do the memories of EPROM type, and which are therefore more costly to produce.

Flash memories. These non-volatile memories do not have the aforesaid disadvantages of EPROM or EEPROM memories, In fact, a flash memory is formed by a plurality of memory cells that can be programmed electrically in individual manner, a large number of cells, referred to as block, sector or page, being able to be erased simultaneously and electrically. Flash memories combine the advantage of EPROM memories in terms of integration density and the advantage of EEPROM memories in terms of electrical erasure.

In addition, the durability and the low electrical consumption of flash memories makes them advantageous for numerous applications: digital photographic devices, cellular telephones, printers, personal assistants, portable computers or even portable devices for reading and sound recording, especially the so-called USB keys, for the English "universal serial bus", which are capable of connecting directly to a "universal serial bus", which has become a standard of micro information technology, and many other applications. Flash memories do not possess mechanical elements, which additionally endows them with quite good shock resistance.

Most flash memories are of "standalone" type, meaning that they are autonomous devices that have large storage capacities, generally larger than 1 gigabit or Gb (1 Gb=$10^9$ bits) and that are dedicated to mass storage applications.

There also exist so-called on-board flash memories, the production of which is integrated with that of a method, for example that known as CMOS, the English acronym for "complementary metal oxide semiconductor", the technological method most widely used by the microelectronics industry for construction of integrated circuits based on "complementary" (C) transistors of "metal oxide semiconductor" (MOS) type. These memories are finding increasing interest, for example in the automobile or microcontroller fields, for storage of data or codes. These on-board flash memories are produced on a chip that also carries CMOS circuits intended to perform logic functions other than data storage. These on-board flash memories are generally produced for storage capacities smaller than those of memories of "standalone" type, and their capacity may vary in general from several bits to several megabits or Mb (1 Mb=$10^6$ bits). The characteristics sought by on-board flash memories are low production cost, excellent reliability (especially at high temperature), low electrical consumption or even high programming speed, these characteristics being a function of the application for which they are intended.

Most of the flash memory points have a structure of MOS transistor type comprising three electrodes: source, drain and gate, the gate making it possible to create a conduction channel between source and drain. Their special feature of permitting non-volatile storage of information is that they additionally have a site for storage of electrical charges, known as a floating gate, which is formed, for example, by a layer of polycrystalline silicon disposed between two oxide layers, positioned between the electrically conductive material of the gate and the transistor channel. Storage is achieved by applying to the conductive material a voltage higher than the threshold voltage, for example between 15 volts and 20 volts, so as to store the information in the form of charges trapped by the floating gate.

However, such memories exhibit disadvantages that limit the reduction of their dimensions. In fact, a reduction of thickness of the tunnel oxide disposed between the channel and the layer of polycrystalline silicon constituting the floating gate leads to an increase of the SILC, the English acronym for "stress induced leakage current", denoting the "leakage current induced by stress". The prolonged use of such a memory, in other words the repetition of write and erasure cycles, eventually generates defects in the tunnel oxide, which tend to evacuate the charges trapped in the floating gate. Similarly, a large SILC or leakage current affects the retention time of the charges in the floating gate. In practice, it is therefore difficult to reduce the thickness of the tunnel oxide of these memories to smaller than 8 nanometers or nm (1 nm=$10^{-9}$ meter) without allowing the SILC to become a critical phenomenon for storage. In addition, by reducing the dimensions of such a memory cell, the parasitic coupling between the floating gates of two adjacent cells of the same memory becomes large and may therefore degrade the reliability of the memory.

For these reasons, memories of MONOS type (Metal Oxide Nitride Oxide Silicon), also known as NROM memories, have been proposed in order to replace the memories with floating gate of polycrystalline silicon. The document U.S. Pat. No. 5,768,192 describes such memories, in which the electrical charges are stored in traps formed in a floating gate composed of nitride and disposed between two oxide layers. In such a nitride layer, the traps are isolated from one another. Thus an electron stored in one of the traps remains physically localized in this trap, thus making these memories much less sensitive to the defects in the tunnel oxide and therefore less impacted by an increase of the SILC. In fact, in the presence of a defect in the tunnel oxide, the memory layer, in other words the nitride layer, loses only the electrons situated close to the defect, the other trapped electrons not being affected by this defect. These memories therefore have better reliability. In this way it is possible to have a tunnel oxide of thickness smaller than approximately 8 nm and therefore to lower the necessary programming voltages. In addition, because of the small thickness of the nitride for forming the memory layer, the coupling between two adjacent memory cells is greatly reduced compared with cells with floating gate of polycrystalline silicon. Finally, the structure of a memory of NROM type is also suitable for producing on-board memories, by virtue of the simplicity of the method for integration of these memories.

The document of S. Kianian and co-authors, "A novel 3 volt-only, small sector erase, high density flash E²PROM", Technical Digest of VLSI Technology, 1994, p. 71", describes another type of memory, known as "split-gate" memory, in other words a memory with "shared gate", which combines, within the same memory cell, a memory transistor and a selection transistor (or control transistor) formed on a single active zone. Such a double-gate memory cell is generally programmed via injection of carriers by the source, a mechanism that requires the presence of a selection transistor joined to the memory transistor, and that makes it possible to increase the programming speed while reducing the consumption compared with a memory of NROM type.

In order to benefit from the advantages of each of the structures hereinabove, in other words: split-gate and NROM, the document US 2004/207025 proposes another type of double-gate memory combining the two structures. One of the difficulties for producing these memories then concerns the control of the relative position of the gates, in other words the position of the gate of the control transistor relative to the position of the control gate of the memory transistor. In fact, these gates are produced by two successive lithographic operations, the disalignment of the second gate relative to the first gate fixing the length of the second gate. Poor control of the relative positions of the two gates therefore translates into poor control of the electrical characteristics of the second transistor and therefore poor performances of the memory. Consequently very precise control of the position of the gates is necessary during the production of this type of memory.

In order to become free of this alignment constraint, the document U.S. Pat. No. 7,130,223 also proposes to produce a double-gate memory combining the structure of a memory of NROM type with split-gate architecture. However, the control gate of the memory transistor is produced in this case in the form of a lateral spacer of the gate of the control transistor, which is disposed against one of the two lateral sidewalls of the gate of the control transistor. Such a structure makes it possible to control the position and the dimension of the control gate of the memory transistor precisely relative to the gate of the control transistor. In fact, since the control gate of the memory transistor is produced in the form of a lateral spacer of the gate of the control transistor, it then becomes self-aligned on the latter.

Nevertheless, with such a structure, it is very difficult then to achieve definition of an electrical contact area on the control gate of the memory transistor, in view of the small dimensions of this gate in the form of a lateral spacer. This problem is illustrated in FIG. 1. FIG. 1a shows a view in section of an example of such a double-gate memory cell. Between source and drain zones 110 and 120 there are disposed the two gates shared by a same cell. As mentioned hereinabove, control gate 140 of the memory transistor is produced on source side 110 in the form of a spacer of gate 130 of the control transistor and because of this is self-aligned thereon. Gate 130 of the control transistor, which is comparable to that of a simple transistor of MOS type, may be produced in traditional manner by diverse means and methods known to the person skilled in the art. In FIG. 1a, it is seen that surface 141, which makes it possible to establish electrical contact with control gate 140 of the memory transistor, is particularly limited in the case of a spacer of triangular shape. Such a shape results most naturally from the formation of the spacer with the means and methods known to the person skilled in the art. Contact surface 141 corresponds to the silicidation of the underlying material, which is polycrystalline silicon 142 and which constitutes the main part of the volume of the memory transistor. The memory capability is typically achieved by means of a stack or sandwich of layers 143 containing a layer for trapping electrical charges. This trapping layer constitutes the floating gate, which functions to trap the charges that memorize the state of the memory cell in the control gate of the memory transistor, as described in the foregoing.

FIG. 1b shows a view in section of another example of such a double-gate memory cell, in which contact surface 141 of the control gate of the memory transistor is enlarged by endeavoring to obtain the most rounded possible shape of the spacer. Nevertheless, this type of shape is difficult to obtain with polycrystalline silicon 142, a material which constitutes the main part of the control gate of the memory transistor.

Defining a contact area on the control gate of the memory transistor is very difficult to employ in the scope of an industrial process, and in particular calls for very constraining positioning specifications so that the connecting vias, in particular those for connecting the control gate of the memory transistor, are always well positioned. A defect of positioning of the vias would prevent the cell from functioning and in particular could create a short circuit between the gate of the control transistor and the control gate of the memory transistor.

One object of the present invention is therefore to propose a new memory cell structure or a new method making it possible to facilitate defining a contact area on each of the gates and to limit the risks of short circuit.

The other objects, characteristics and advantages of the present invention will become apparent upon examination of the description hereinafter and of the accompanying drawings. It is understood that other advantages may be incorporated.

SUMMARY OF THE INVENTION

To achieve this objective, one aspect of the present invention relates to a method of making a non-volatile double-gate memory cell comprising a control transistor comprising a control transistor comprising a gate and a memory transistor comprising a control gate adjacent to the gate of the control transistor, wherein there take place the steps of:

forming at least partly the gate of the control transistor, comprising obtaining a relief of a semiconductor material on a substrate;

forming the control gate of the memory transistor. The formation of the control gate preferably comprises the steps of: forming on at least one sidewall of the relief of a semiconductor material and at least one part of the substrate of a stack of layers configured to store electrical charges; depositing a first layer of preferably semiconductor material so as to cover the stack of layers at least; etching of the first layer so as to form a first pattern, preferably juxtaposed on the relief of a semiconductor material of the gate of the control transistor.

Preferably, the formation of the control gate of the memory transistor additionally comprises the following steps of: forming a second layer, preferably of a semiconductor material, at least on the first pattern; etching of the second layer so as to form on the first pattern a second pattern having a substantially plane upper face. Advantageously this surface is adapted to permit defining a contact area on the control gate of the memory transistor.

The contact surface of the control gate of the memory transistor is therefore significantly extended. The positioning of the gate relative to a via for connection with the upper circuitry layers is therefore facilitated. In addition, the risks of poor positioning and the risks of short circuit between the gates are reduced.

Furthermore, the volume of material subsequently accessible and available for performing silicidation is also increased, thus making it possible to improve the electrical connection between the gate of the control transistor and the circuitry layers.

Another aspect of the present invention relates to a memory cell obtained according to the process described hereinabove.

Another aspect of the present invention relates to a non-volatile double-gate memory cell comprising a control transistor comprising a gate and a memory transistor comprising a control gate adjacent to the gate of the control transistor, the gate of the control transistor comprising a relief of a semiconductor material and the control gate of the memory transistor comprising:

a stack of layers juxtaposed on the gate of the control transistor, continuing over part at least of the substrate and configured to store electrical charges, a first pattern of a semiconductor material disposed on the stack of layers at least and having a substantially triangular section.

In addition, the control gate of the memory transistor additionally comprises a second pattern of a semiconductor material disposed on the first pattern and configured to have a substantially plane upper face.

BRIEF DESCRIPTION OF THE FIGURES

The objectives, objects, as well as the characteristics and advantages of the invention will become more apparent from the detailed description of an embodiment thereof illustrated in the accompanying drawings hereinafter, wherein:

FIG. 3, which comprises

Figure 1A:
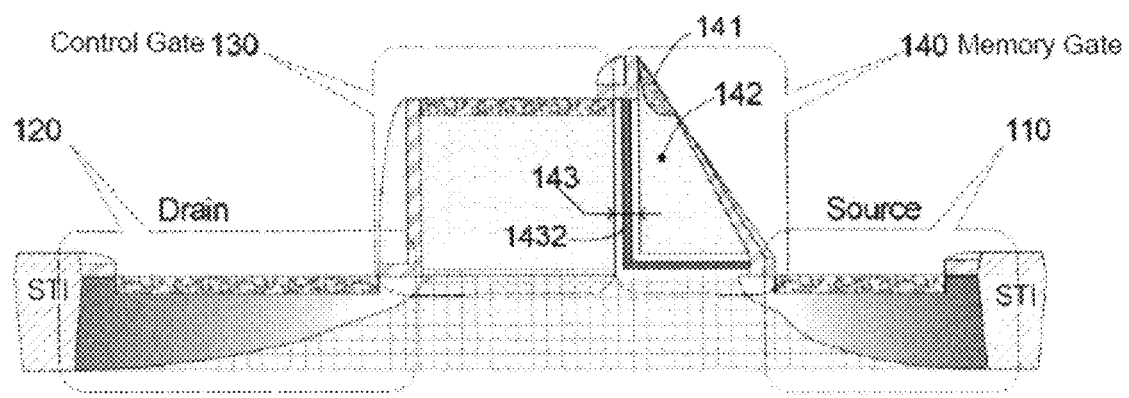
FIG. 1a, 1b illustrate the double-gate memory cells of the prior art.

The attached drawings are given by way of examples and are not limitative of the invention.

DETAILED DESCRIPTION OF THE INVENTION

It is recalled that one of the objectives of the invention is to obtain a broader zone for defining a contact area, thus making it possible to position a via for connection with the upper circuitry layers easily on the memory transistor.

It is clarified that, within the scope of the present patent application, the term "on" does not necessarily mean "in contact with". Thus, for example, the deposition of a layer of polysilicon on a layer of insulator does not necessarily mean that the layer of polysilicon is directly in contact with the layer of insulator but that means that it covers it at least partly, either by being directly in contact therewith or by being separated therefrom by another layer or another element.

Before beginning a detailed review of embodiments of the invention, optional characteristics that may be used in association or alternatively if applicable are listed below:

The first pattern is situated on the sidewall of the relief of the gate of the control transistor and on the stack of layers.

The first pattern has a substantially triangular cross section. Alternatively, it has a substantially rounded upper portion. The second pattern then continues this upper portion to form a substantially plane face.

The relief of a semiconductor material constitutes the gate of the control transistor. It forms a line or a rectangle. If the sidewalls of the relief of a semiconductor material are substantially perpendicular to the substrate, then the first pattern has a cross section of right triangular shape, wherein the two sides opposite the hypotenuse are respectively turned toward the gate of the control transistor and toward the insulating well.

The second pattern has substantially parallelepiped shape, one side of the parallelepiped forming the substantially plane upper face. The face is that farthest removed from the substrate.

The cross sections of the first and second patterns are measured in a plane substantially perpendicular to the surface of the substrate supporting the memory cell (or surface on which the gate of the control transistor is disposed).

The control gate of the memory transistor forms a spacer for the gate of the control transistor.

Preferably, the formation of the stack of layers comprises steps of deposition applied over the entirety of the plate.

The deposition of the first layer is applied so that the first layer covers one sidewall at least of the relief of semiconductor material and continues on the substrate. Preferably, the deposition of the first layer is applied over the entirety of the plate. Preferably the first layer is deposited directly on the stack of layers.

Advantageously, the deposit of the first layer is a conforming deposit.

Advantageously, the thickness of the deposit of the first layer is at least equal to one quarter of the thickness of the relief of a semiconductor material of the gate of the control transistor. Preferably, the thickness of the deposit of the first layer is at least equal to half of the thickness of the relief of a semiconductor material of the gate of the control transistor. Still more preferably, it is approximately equal to the thickness of the relief of a semiconductor material of the gate of the control transistor. This relative thickness makes it possible to better control the final width of the control gate of the memory transistor after standard etching.

Preferably, the deposition of the second layer is applied so that the second layer covers the first pattern and continues on the substrate.

Preferably, the formation of the second layer consists of one deposit.

Advantageously, the formation of the second layer is achieved so that its thickness is constant over the entire deposited surface. The formation of this layer therefore constitutes a conforming deposit.

Advantageously, the thickness of the second layer is adapted to adjust the width of the substantially plane upper face, which is intended to be available for defining a contact area, as a function of an upper angle formed by the first pattern of substantially triangular section. The upper angle is the angle farthest removed from the substrate. In this way it is relatively easy to define the surface to be used to achieve definition of a contact area.

Preferably, the thickness of the deposit of the second layer is between one quarter and two times the thickness of the relief of a semiconductor material of the gate of the control transistor. Advantageously, the thickness of the deposit of the second layer is between one third and one times the thickness of the relief of a semiconductor material of the gate of the control transistor. Still more advantageously, the thickness of the deposit of the second layer is approximately equal to half of the thickness of the relief of a semiconductor material of the gate of the control transistor. In this way a large surface is obtained, thus making it possible to facilitate the definition of a contact area.

Advantageously, the method comprises at least one sequence of steps performed at the end of etching of the second layer. Each sequence comprises at least the deposition of an additional layer of a material similar to that of the second layer then anisotropic etching of this additional layer, the etching being directed in a manner perpendicular to the plane of the substrate. In this way it is possible to obtain a plane and extensive upper surface even if the anisotropic etching is not perfectly anisotropic. Preferably, the thickness of the deposit of the additional layer is adjusted to obtain an upper face presenting the desired surface area at the end of the sequence. Each sequence is preferably performed before the step of protection of the patterns by a resin.

Advantageously, the step of at least partial formation of the gate of the control transistor comprises, prior to the deposition of the first layer, the formation of a sacrificial layer, also above the relief of a semiconductor material. The method also comprises a step of stripping of the sacrificial layer, carried out subsequent to the step of etching of the second layer, so as to generate a difference of level between the upper face of the second pattern and the upper end of the relief of a semiconductor material. The upper end of the relief of a semiconductor material is the highest dimension of the gate of the control transistor, measured in a direction perpendicular to the plane of the substrate. In this way, the upper face is higher than the end of the relief. The risks of short circuits are therefore reduced even more.

The formation of the control gate of the memory transistor is carried out so that the control gate of the memory transistor is self-aligned with the gate of the control transistor.

The semiconductor material of the first layer is identical to the semiconductor material of the second layer.

Preferably, the relief of a semiconductor material forming the gate of the control transistor is of silicon. Preferably this is polycrystalline silicon.

Preferably, the semiconductor material of the first layer is of polycrystalline silicon.

Preferably the semiconductor material of the second layer is of polycrystalline silicon. The method according to the invention is even more advantageous when the material used for the control gate of the memory transistor is of polycrystalline silicon. In fact, with this type of material, it is particularly difficult to obtain a first pattern having a rounded upper shape.

Advantageously, the etching of the first layer comprises: a first anisotropic etching directed perpendicular to a plane of the substrate. This etching leaves in place a residual layer that is less thick on the surfaces parallel to the plane of the substrate than on the surfaces inclined relative to the plane of the substrate, in other words typically on the sidewalls of the relief. The first etching also may cause the first layer to disappear on the surfaces parallel to the plane of the substrate. Preferably, at the end of the first etching, a portion of the first layer remains on the surfaces parallel to the plane of the substrate, and the method comprises a second selective isotropic etching that lifts off the residual layer, with stopping of the etching on the said stack of layers.

Advantageously, the etching of the second layer comprises: a first anisotropic etching directed perpendicular to the plane of the substrate. This etching leaves in place a residual layer that is less thick on the surfaces parallel to the plane of the substrate than on the surfaces inclined relative to the plane of the substrate, in other words typically on the sidewalls of the first pattern. The second etching also may cause the second layer to disappear on the surfaces parallel to the plane of the substrate. Preferably, at the end of the second etching, a portion of the second layer remains on the surfaces parallel to the plane of the substrate, and the method comprises a second selective isotropic etching that lifts off the residual layer, with stopping of the etching on the said stack of layers. In this way the end of etching and the thickness of each of the deposited layers is controlled perfectly, which will make it possible to define the contact surface for the connection of the control gate of the memory transistor.

In this way the etching of the first layer and/or of the second layer comprises, after the first anisotropic etching, a second selective isotropic etching, with stopping of the etching on the stack of layers.

The formation of the stack of layers is carried out so that it continues on the substrate. The stack of layers comprises two layers of electrical insulator fitting around an intermediate layer for trapping of charges.

The method comprises a step of covering the second pattern by at least one additional layer of high temperature oxide, the additional layer of high temperature oxide being covered in an advantageous alternative by an additional layer of silicon nitride. The method additionally comprises a step of partial stripping of the additional layer, so as to leave the substantially plane upper face free in part at least. Preferably, the entire substantially plane upper face is deprotected.

The method additionally comprises a step of silicidating the substantially plane upper face.

FIG. 2, which comprises FIGS. 2a to 2e, illustrates the steps of an example of the method according to the invention that makes it possible to obtain a larger contact surface on the memory transistor and more precisely on the control gate of the memory transistor.

Figure 2A:
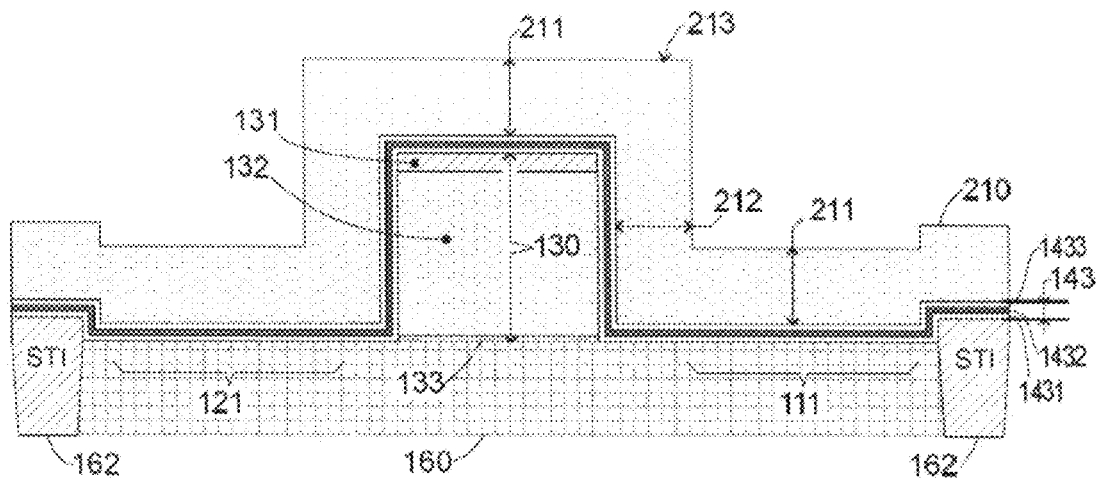
FIG. 2, which comprises FIGS. 2a to 2e, describes steps of the method according to the invention that make it possible to achieve definition of a much broader contact area on the control gate of the memory transistor of a double-gate memory cell.

FIG. 2a is a view in section, similar to that of FIG. 1a, of a double-gate memory cell at a stage of the manufacturing process in which the control transistor has already been formed at least in part and in which it is ready for production of the self-aligned memory transistor without having to rely on lithography operations. It is recalled that the control transistor and the memory transistor share the same source and the same drain. They are therefore included in the same cell. This cell is usually referred to as a double-gate transistor, each of the gates making it possible to perform the function of the transistor, either control or memory, to which it is dedicated. Up to this stage, the manufacture of such a memory cell is carried out by using the conventional methods and means employed by the microelectronics industry, especially those for the manufacture of transistors of MOS type. In a standard manner, these transistors, just as the double-gate memory cells of the invention, are each manufactured in a well 160 of monocrystalline silicon. The wells are electrically isolated from one another by trenches 162, typically of silicon oxide. The formation of these trenches relies on a technique known as STI, from the English "shallow trench isolation", in other words "isolation by trenches of little depth". Trenches 160 of monocrystalline silicon are in fact most often formed from the thin surface layer of monocrystalline silicon of a prepared substrate of SOI type, from the English "silicon on insulator", in other words a "silicon on insulator" substrate. This layer of monocrystalline silicon is itself placed above a "buried oxide layer", most often referred to by its acronym BOX, from the English "buried oxide layer". Each well is therefore completely electrically isolated from its neighbors, laterally and at the bottom, by the oxide. Although not necessary for understanding of the method of the invention, it will be noted that there are represented only the surface layer and lateral trenches 162 in which wells 160 are formed. Furthermore, the employment of an SOI substrate is only one particular example of use. Other means and methods may be used so that a double-gate memory cell employing the method described hereinafter can be produced in an isolated well 160 and which would be obtained in a manner other than from an SOI substrate.

The gate of the control transistor, also referred to as control gate, the geometry of which was defined by photolithography, comprises at this stage several layers, which are: a relief of semiconductor material 132, preferably of polycrystalline silicon, assuring the gate function; an oxide layer 133 of the MOS structure, underneath which, as a function of the voltage applied on the gate of the control transistor, a conduction channel (not represented) will be created at the surface of well 160 between source and drain zones 111 and 121 respectively, which are not yet formed at this stage; optionally but advantageously, an oxide layer 131, which will be lifted off, as will be seen later, to create advantageously a difference of level for defining a contact area on the control gate of the memory transistor in order to prevent a short circuit with the selection gate. This oxide layer 131 may be described as a sacrificial layer. Source 111 and drain 121 will generally be obtained by ion implantation of a dopant of the monocrystalline silicon layer of isolating well 160. Since gate 130 of the control transistor functions as mask, source and drain will be self-aligned thereon, as will be seen later. At this stage it will be possible to carry out a first ion implantation (not represented) in order to adjust the conduction threshold (VT) of the memory transistor.

FIG. 2a shows the layers that are deposited over the entirety of the devices in the course of manufacture with a view to producing the memory transistor, in other words at the surface of a wafer of a semiconductor forming a substrate. After formation of control gates 130, layers forming the stack or sandwich of layers 143 containing the trapping layer are successively deposited. A non-limitative example of trapping layer is a layer denoted by its acronym ONO, in other words "oxide nitride oxide" of silicon. Interior layer 1432 of silicon nitride (Si$_3$N$_4$) constitutes the floating gate, which functions to trap the charges that memorize the state of the memory cell in the memory transistor, as described in the foregoing. Other structures are possible. The sandwich in this example has three layers: a first layer, denoted lower layer 1431, forming an electrical insulator, most often silicon oxide or SiO2; a second layer, denoted intermediate layer or trapping layer 1432, serving to trap the charges intended to memorize the state of the memory cell, and typically consisting of silicon nitride or Si$_3$N$_4$; a third layer, denoted upper layer 1433, also forming an electrical insulator, produced, for example, from silicon oxide, as for the first layer.

A first layer of polycrystalline silicon 210 is then deposited. This layer is intended to contribute to the formation of control gate 140 of the memory transistor, also referred to as memory gate. Preferably, the gate of the control transistor, as was seen hereinabove, is also constituted of polycrystalline silicon that was deposited and etched previously in conventional manner. Ideally, the deposit will be as "conforming" as possible. A deposit is said to be conforming when the thicknesses deposited are the same, independently of the angle of inclination of the surfaces on which it is formed. The thickness is therefore homogeneous at every point of the covered surface, the thickness being measured in a direction perpendicular to the free surface of the layer. Such a result may be obtained, for example with a deposition method falling within the category of those known as LPCVD, the English acronym for "low pressure chemical vapor deposition", in other words "chemical deposition in vapor phase at low pressure". As represented in FIG. 2a, it is then possible to obtain a horizontal deposit thickness 212 substantially equal to vertical thickness 211.

To begin to produce the control gate of the memory transistor in the form of a broadened spacer of the gate of the control transistor, etching of layer 210 of polycrystalline silicon is then performed in two steps.

In a first step, highly anisotropic etching of layer 210 is performed, making it possible to reduce the thickness of the polycrystalline silicon uniformly in a privileged direction perpendicular to the plane of the substrate. This type of etching may be achieved by using the traditional etching tools available in microelectronics, in particular, by using those involving physical bombardment by means of inert gases, in preference to those using reactive gases inducing a chemical reaction. This first etching must make it possible to maintain surface 213 of polycrystalline silicon layer 210 situated above the stack of layers of gate 130 of the control transistor as flat as possible, in other words, as represented ideally in the figures, by keeping changes of levels as abrupt as possible. At the same time, the thickness of polycrystalline silicon outside the stack of layers of the gate of the control transistor is reduced. At the end of this first etching step, typically a thickness 211 of polycrystalline silicon on the order of 5 to 10 nm is left above the gate of the control transistor and over all the horizontal surfaces, in other words those parallel to the plane of the substrate.

In a second step, more isotropic etching is performed on what remains of polycrystalline silicon layer 210. The advantage is that, with this type of etching, it is possible to achieve very good selectivity between etching of the polycrystalline silicon and etching of underlying insulating layer 1433 (silicon oxide). It is on the latter layer that polycrystalline silicon was deposited to form layer 210. It then will be easily possible to stop the isotropic etching of the polycrystalline silicon on this insulator layer.

Figure 2B:
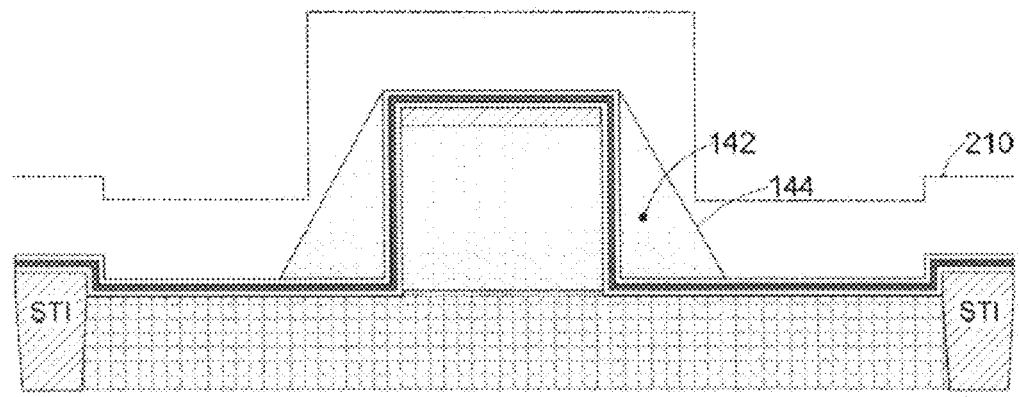

FIG. 2b shows the result of the two preceding etching steps. As already discussed in the section on the prior art, it is extremely difficult to obtain a rounded spacer shape, which would be more favorable for defining a contact area on the control gate of the memory transistor. After the etchings described hereinabove, a pattern 144 of triangular shape is instead obtained for what remains, on the sidewalls of the gate of the control transistor, of polycrystalline silicon 142 originating from layer 210. This triangular shape is obtained regardless of the thickness initially deposited to form this layer by means of the methods traditionally used in microelectronics. Preferably, a layer 210 of thickness substantially equal to that of polycrystalline silicon layer 132, which served to form the gate of the control transistor, is deposited. The triangular shape of pattern 144 results mainly from the fact that the etchings are never perfectly anisotropic or perfectly isotropic and that the angles at the changes of level are always attacked preferentially.

Figure 2C:
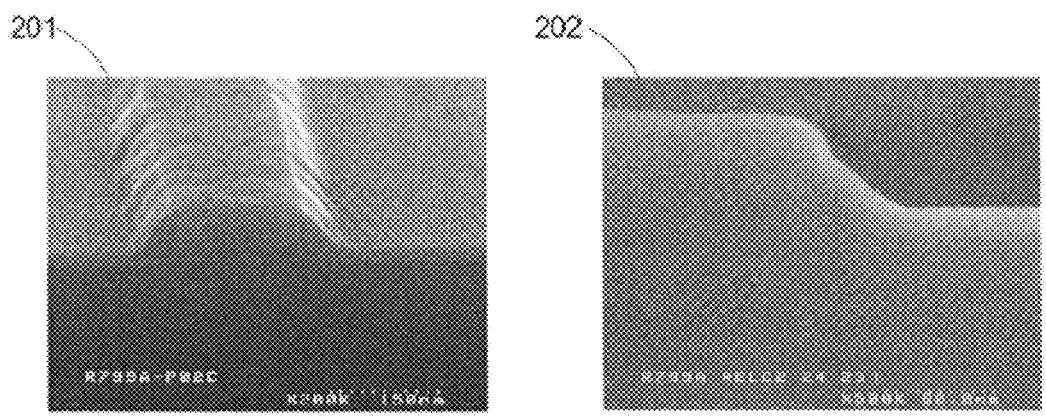

FIG. 2c illustrates, by means of photographs made with a scanning electron microscope (SEM), the triangular shape obtained independently of the thickness of the deposited silicon layer. Photo 201 shows the result obtained with a deposited layer of 65 nm thickness. Photo 202 shows the case of a double thickness of the deposit, in other words 130 nm.

Figure 2D:
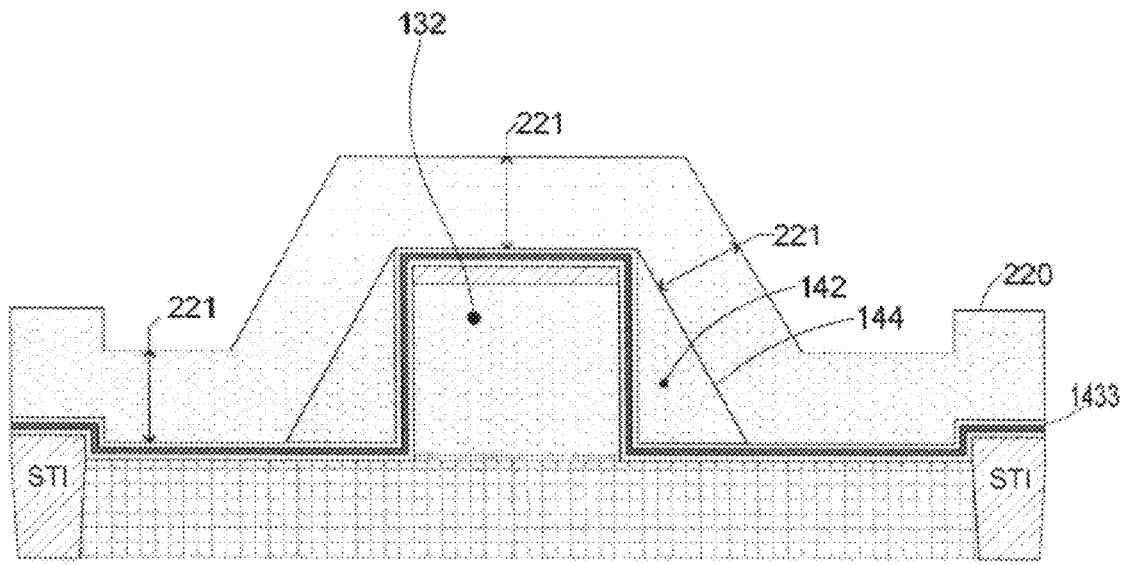

FIG. 2d illustrates an additional step consisting of forming a second layer 220 above gate 130 of the control transistor and patterns 142 formed by first layer 210 already in place.

Preferably, this second layer 220 is obtained by conforming deposition of polycrystalline silicon. It is intended to broaden the spacer forming the control gate of memory. Thickness 221 of this second layer 220 is adjusted as a function of the final width being sought for the spacer, as will be seen in the following figures. Since the deposit is conforming, deposited thickness 221 is the same over all the surfaces, regardless of their inclination. Before second layer 220 is deposited, cleaning with hydrofluoric acid (HF) is carried out in order to remove the oxidized layer that was formed spontaneously in the presence of air on triangular pattern 144 consisting of polycrystalline silicon 142 originating from the first deposit. For example, thickness 221 of second layer 220 of polycrystalline silicon is approximately half that 211 of first deposit 201.

Figure 2E:
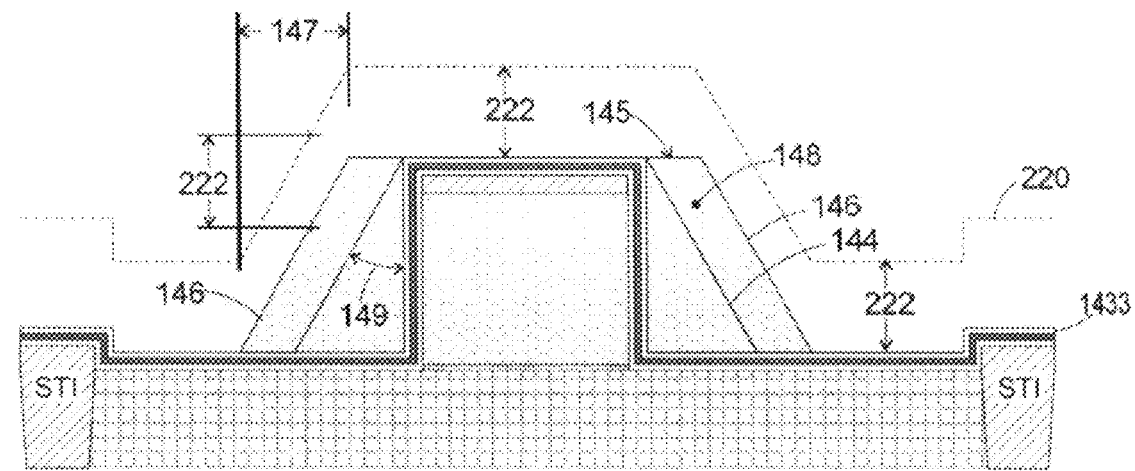

FIG. 2e shows the result of etching of second layer 220 of polycrystalline silicon, which was deposited as described in the preceding figure. The etching takes place in two steps in a manner identical to that described for the etching of layer 210 corresponding to the first deposit of polycrystalline silicon serving to form the control gate of the memory transistor. A first anisotropic etching is therefore performed in a direction perpendicular to the plane of the substrate. This first etching is followed by a more isotropic or even isotropic etching which is, as has been seen, selective with respect to upper layer 1433 forming an insulator and in this example constituted by a silicon oxide. That makes it possible to stop the etching on upper layer 1433 of insulator immediately underlying stack 143 of ONO layers.

After etching, what remains of second layer 220 corresponding to the second deposit is pattern 140, preferably made of polycrystalline silicon 148, which contributes to substantially broadening the control gate of the memory transistor. The method is configured so that this pattern 146 has an upper face 145 as plane as possible, which will greatly facilitate definition of a contact area on this electrode.

Since etching 222 of second layer 220 is mainly anisotropic, it is performed vertically, in other words perpendicular to the plane of the substrate. Since the thickness to be etched is then greater than in inclined zone 147 corresponding to the hypotenuse of triangular pattern 144, pattern 146 remains on both sides of the gate of the control transistor after etching.

If angle 149 forming the hypotenuse of pattern 144 with the vertical is known, it is easily possible to estimate the width of upper plane face 145 of pattern 146 that will be obtained, by adopting the simplifying hypothesis that the etching is totally anisotropic and takes place starting from a perfectly conforming deposit of thickness 221. It is therefore also possible to determine thickness 221 of second layer 220 that must be deposited to obtain a given width of face 145 and in this way to adjust the total width of the control gate of the memory transistor.

Typically, to determine the thickness to be etched at a sidewall of the polycrystalline silicon relief, it is possible to perform the following calculation, based on the shape of pattern 144. The pattern is obtained after the first etching and has a cross section corresponding substantially to that of a right triangle. Thickness to be etched 222 is therefore equal to the thickness of the deposit of second layer 220 divided by the value of the sine of angle 149.

For example, with an angle 149 of 45°, it is found that the width of upper plane face 145 obtained corresponds to thickness 221 of the second polycrystalline silicon deposit multiplied by a coefficient in this case equal to 0.5, in other words cosine 45°. This is for the ideal conditions mentioned hereinabove: a deposit of perfectly conforming second layer 220 and completely anisotropic etching. Of course, this calculation may be generalized to any arbitrary angle 149. From a practical viewpoint, it will be noted simply here that, regardless of the observed multiplication coefficient, the width of upper plane face 145 increases with thickness 211. It therefore may be adjusted in the best way for the application under consideration by controlling the thickness of the deposit of second layer 220 serving to form the control gate of the memory transistor. This result can be compared with triangular pattern 144 obtained after etching of the deposit of the first layer which, as has been seen in FIGS. 2c and 2d, did not vary when the thickness of this first layer was increased.

It may be that in practice upper face 145 of second pattern 146 is not perfectly plane or its width is smaller than planned. This is due to the fact that the etching is rarely perfectly anisotropic. According to an advantageous embodiment of the invention, at least one sequence of steps is then carried out, the sequence comprising at least the following steps: the deposition of an additional layer of a material similar to that of second layer 220, then anisotropic etching of this additional layer. At the start of the sequence, the thickness of the deposit of the additional layer is adjusted to obtain, at the end of the sequence, an upper face 145 having the desired surface area.

Preferably, each sequence comprises a step of cleaning before the step of deposition of the additional layer.

In one embodiment, the method comprises a single sequence. In another embodiment, particularly for obtaining an extended surface 145, the method comprises two or more sequences.

These sequences are preferably effected between the steps referenced 2e and 3a in the figures. Each sequence is preferably carried out before the step of protection of the patterns by a resin.

By influencing the thickness of the deposit of second layer 220 as well as the optional sequences of deposition and etching of additional layers, the deposit thicknesses of which will have been carefully controlled, the invention makes it possible to obtain an upper face 145 having precisely controlled planarity and surface area.

FIG. 3, which comprises FIGS. 3a to 3f, describes the subsequent steps of the method of formation of the control gate of the memory transistor. These steps make it possible to finalize the structure of the memory cell having a much larger surface for definition of a contact area by virtue of the previous application of the steps described in reference to the preceding figures.

Figure 3A:
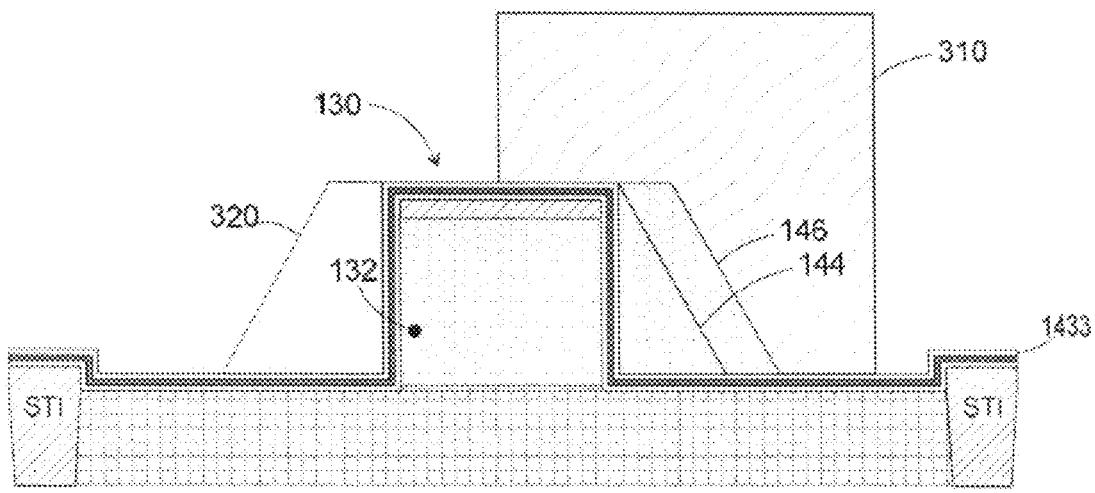
FIGS. 3a to 3f, illustrates the additional steps that complete the formation of the control gate of the memory transistor of a double-gate memory cell.
Figure 4:
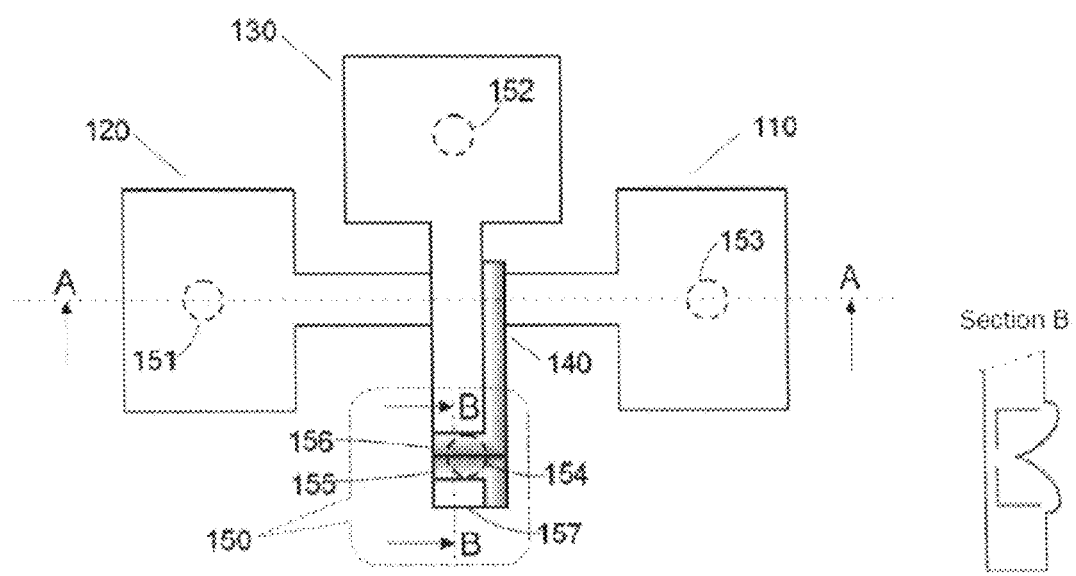
FIG. 4 illustrates a double-gate memory cell according to a particular embodiment, which may be optionally obtained by employing the method according to the invention.

FIG. 3a illustrates the step in which the zone of memory transistor 140 that will be protected is defined. As illustrated in FIG. 4, which will be described in detail later, this figure being is a plan view of a non-limitative example of a memory cell, only part of the spacer created with the two polycrystalline silicon layers 210 and 220 is left in existence by photo etching, as explained in FIGS. 2a to 2e. This spacer was created without lithography all around the gate of the control transistor, and it is left only on one of the sidewalls of the latter to form control gate 140 of the memory transistor there. Optionally, it is possible to create a broader zone 150 for definition of a contact area, for example in the continuation of gate 130 of the control transistor, as illustrated and described with reference to FIG. 4. FIG. 3a shows in section the layer of photosensitive resin used by the corresponding photolithography operation after development of the patterns. Resin patterns 310 protect the part of the spacer, constituted by patterns 144 and 146, which must remain in place.

Figure 3B:
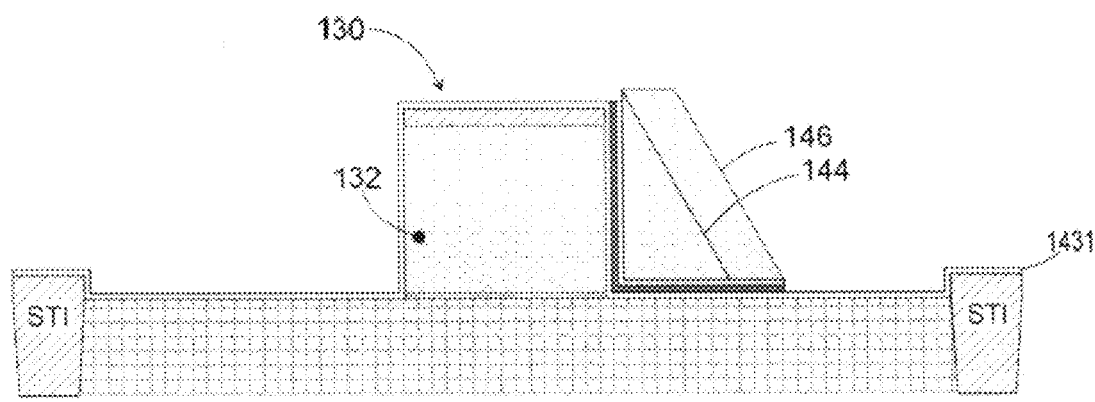

At this stage, dry etching of the patterns obtained from the two layers 210 and 220 that were deposited to form the spacer is carried out in the zones not protected 320 by resin patterns 310. The etching of the two upper layers of stack 143 of ONO layers then is performed with stopping in lower layer 1431. FIG. 3b illustrates this step, in which the resin is also removed. Upper layer of insulator 1433 (silicon oxide in this example) then intermediate layer 1432 (silicon nitride in this example) are successively etched. The etching is performed over the entire surface of the devices in the course of manufacture. Sandwich 143 of ONO layers is protected from attack in the memory transistor by patterns 144 and 146 (polycrystalline silicon patterns in this example). FIG. 3b is a view in section at the end of this etching. Only lower insulator layer 1431 (silicon oxide in this example) of the ONO layer serving to stop the etching above remains in place at this stage. The etching known as "dry" is etching of RIE type, the English acronym for "reactive ion etching", in other words "reactive ionic etching" or "etching by reactive ions". In this technique, the plasma reacts not only physically but also chemically with the surface of a wafer exposed to it, while stripping part of certain of the substances that were deposited thereon previously. The plasma is generated under low pressure of $10^{-2}$ to $10^{-1}$ torr by one or more electrical or even magnetic fields. The high-energy ions of the plasma attack the surface of the wafer by reacting with it.

It will be noted here that stack of ONO layers 143 is only one typical example of employment of the trapping layer necessary for production of the memory transistor, which is often also referred to by the generic term "interpoly".

Figure 3C:
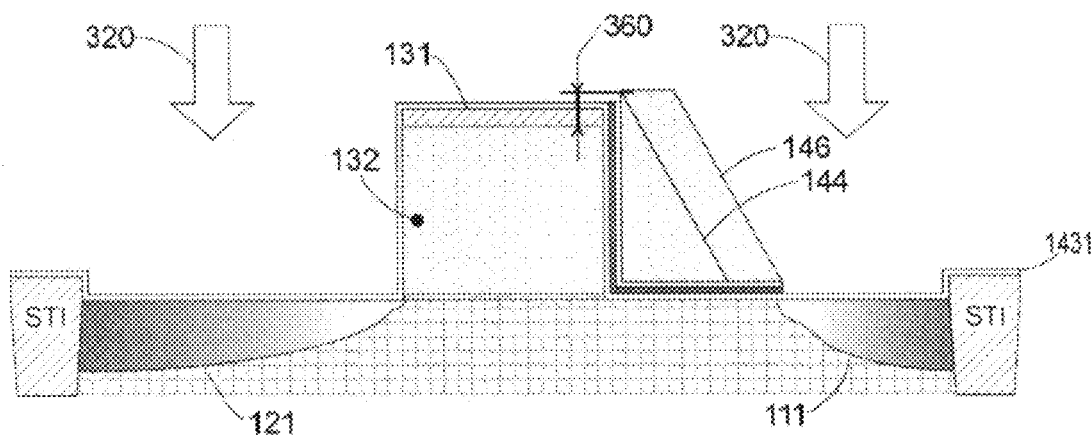

FIG. 3c illustrates the step in which source and drain zones 121 and 111 respectively are doped. In the course of this step there are undertaken, prior to, ion implantation operation 320 intended to dope the source and drain zones, a wet etching of layer 1431 remaining from stack of layers 143 and deposition of a layer of an oxide known as "screen", for example in a thickness of 3 nm. This screen layer, not represented, is intended to protect the underlying silicon during ion implantation 320 forming source and drain.

Typically this is followed by annealing of the implanted dopants, by stripping of the screen oxide and by deoxidation of sacrificial layer 131, also referred to as hard mask, still present on the gate of the control transistor. The removal of sacrificial layer 131 advantageously makes it possible to create an offset 360 between polycrystalline silicon 132 of the gate of the control transistor and that of the control gate of the memory transistor, formed from patterns 144 and 146. This difference of levels created in this way makes it possible to minimize the risks of short circuit between these two electrodes.

Figure 3D:
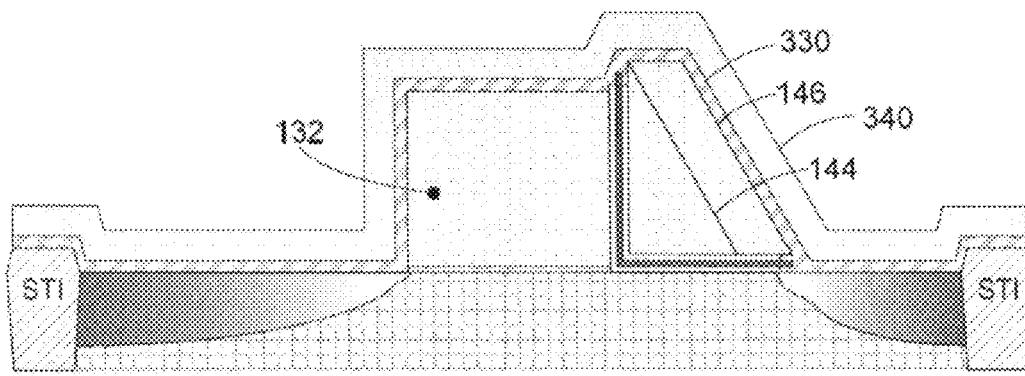
Figure 3E:
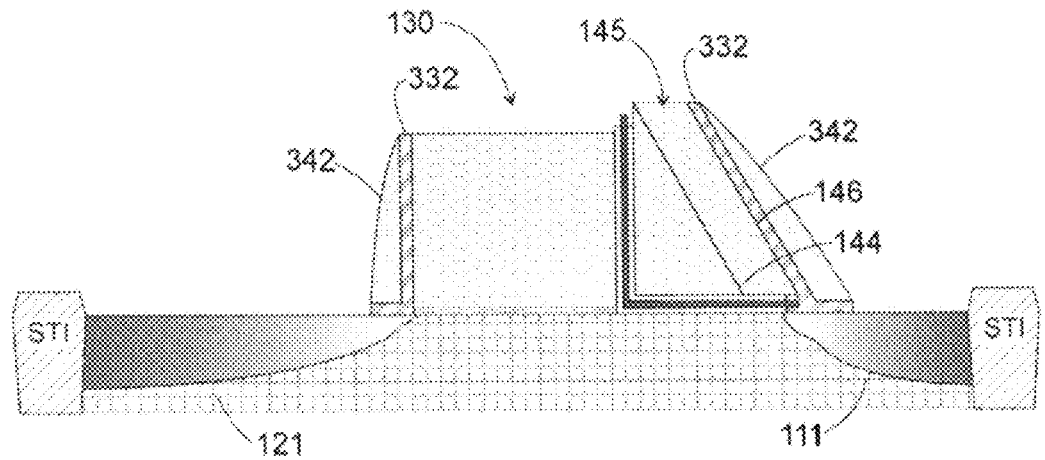

FIGS. 3d and 3e illustrate the production of spacers after lower layer 1431 of stack of ONO layers 143 has been lifted off as well as sacrificial oxide layer 131, which serves to create, as has just been seen, a difference in levels between the height of the gate of the control transistor and the height of that 140 of the memory transistor to minimize the risks of short circuit. Preferably, sacrificial layer 131 is disposed between relief 132 of polycrystalline silicon and stack of layers 143. Preferably, the thickness of the sacrificial layer is between ⅕ and ⅓ of the thickness of the polycrystalline layer forming the gate of the control transistor. Preferably, the thickness of the sacrificial layer is between several nanometers and several tens of nanometers. In this way it makes it possible to position the upper end of relief 132 of polycrystalline silicon at a level lower than upper face 145 of second pattern 146. The risks of poor connections with the interconnections are therefore significantly limited and the risks of short circuits are reduced.

A layer 330 is then deposited. According to an advantageous example, this layer is an oxide referred to as HTO, for the English "high temperature oxide", in other words "oxide at high temperature", obtained by the LPCVD technique already mentioned in the foregoing. Typically, a thickness of 10 nm is deposited. In any case, this thickness must be sufficient to fill the voids resulting from isotropic etching of the oxide layers of stack 143 of ONO layers interposed previously. This layer will serve as attachment layer and as stop layer for etching during the subsequent formation of gate spacers.

As shown in FIG. 3d, the deposition of layer 330 is followed by deposition of a layer 340, for example of silicon nitride ($Si_3N_4$). This deposition may be achieved by the same technique as that hereinabove of low-pressure chemical vapor deposition (LPCVD). There is deposited a layer of silicon nitride that typically has a thickness ranging from 20 to 40 nm and which will serve as gate spacer for the subsequent operations of implantation and silicidation of the contacts.

FIG. 3e shows the result of etching of the upper layers, in other words: layer 330 of HTO and layer 340 of $Si_3N_4$. Conventionally, the etching of these layers is highly anisotropic in a first step, in order to leave in place, on the sidewalls of the control and memory gates, patterns 332 of HTO and patterns 342 of $Si_3N_4$, which serve as gate spacers for the subsequent silicidation operation. This highly anisotropic etching is followed by more isotropic etching in order, as described in the foregoing, to be selective and to permit stopping of etching on the polycrystalline silicon of the control and memory gates. This second etching must be sufficient to uncover top 145 of pattern 146 serving as contact on the control gate of the memory transistor and the top of the gate of the control transistor that will be silicidated to assure good electrical contact.

Typically, at this stage, a second implantation of the electrodes of source 111 and drain 121 is also carried out in order to reduce the electrical resistance from them. This second implantation is self-limited by the gate spacers that have just been produced.

Figure 3F:
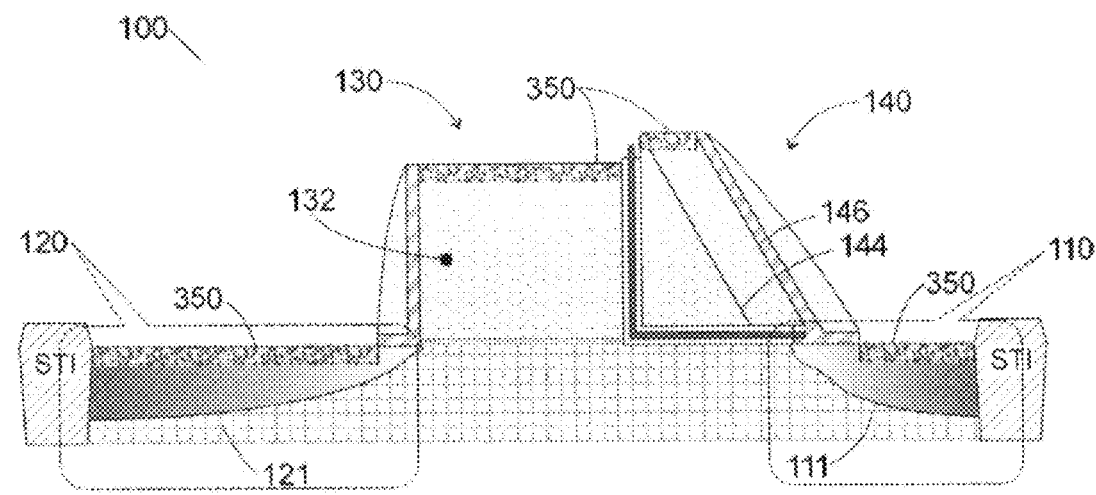

FIG. 3f shows zones 350 that are then silicidated in order to obtain better electrical contact with the vias, shown in FIG. 4, which provide access to the electrodes of the double-gate memory cell: gate 130 of the control transistor and control gate 140 of the memory transistor as well as source and drain. Just as the second implantation hereinabove, the silicidation of the contacts is self-limited by the gate spacers.

An additional advantage of the present invention lies in the fact that the volume of semiconductor material accessible for performing the silicidation step is increased compared with the known methods. The volume of silicidated zones is therefore increased and the electrical contact is improved.

This operation completes the formation of electrodes and active elements of non-volatile double-gate memory cells 100 capable of benefiting from the method of the invention. The subsequent operations relate to the formation of all of the interconnections between the components and memory cells of a device, those referred to as "end of line" or BEOL, for the English "back end of line", which may be performed in standard manner.

Figure 1B:
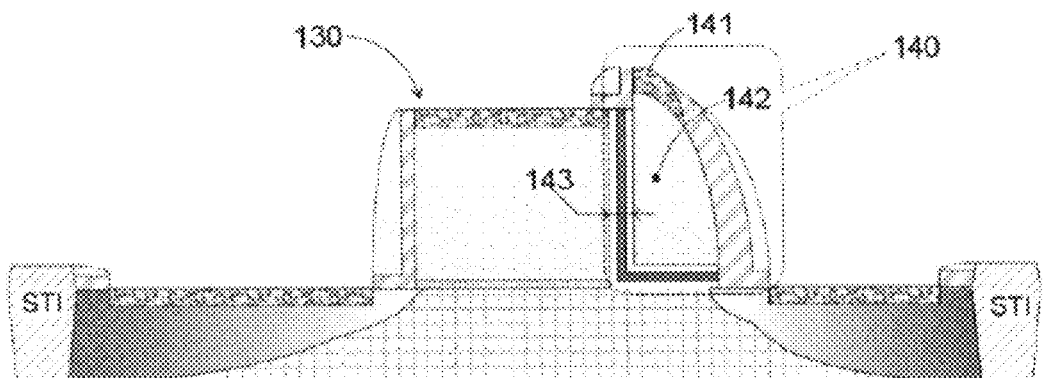

FIG. 4 illustrates a plan view of a particular and non-limitative example of the invention of a double-gate memory cell. This plan view shows the four electrodes controlling the memory point. It will be noted here that FIGS. 1a and 1b are views according to section A of the memory cell, but on a different scale. This view reveals in particular source 110, drain 120 and gate 130 of the control transistor. Source 110, drain 120 and gate 130 of the control transistor are formed by lithography. As represented, it is possible to provide broad connection surfaces intended to receive vertical connections, in other words vias 151, 152 and 153, which assure the interconnections with the horizontal circuitry layers (not represented) of the device containing such memory cells. The cell also comprises a control gate 140 of the memory transistor. Control gate 140 of the memory transistor is formed, without having to rely on lithography, as a spacer on one of the sidewalls of gate 130 of the control transistor. The connection surface is much smaller, as already seen hereinabove. An improvement achieved by this particular memory-cell structure compared with the conventional structures consists in substantially doubling this contact surface by creating a zone 150 for defining an electrical contact area, which in this example is situated in the continuation of gate 130 of the control transistor. It is then arranged that two spacers are left in this zone, between the end of gate 130 of the control transistor and a separate pattern or block 157, preferably of the same width and same composition as gate 130 of the control transistor, at a distance such that they will be in contact as shown schematically in section B. It is in this region that a via 154 will be able to assure electrical contact with gate 130 of the control transistor. In practice, such a zone for defining a contact area is fully useful only if a rounded or plane shape of the spacer can also be obtained at the same time, as in the example of FIG. 1b.

In general, the memory cell, a particular example of which is represented in FIG. 4, may have the following characteristics. It comprises at least:

an active zone formed in a layer of semiconductor and having a channel disposed between a source 110 and a drain 120, a first gate disposed at least on part of the channel, at least one portion 155 of a first lateral spacer disposed against at least one lateral sidewall of the first gate, one part of which forms a second gate disposed on at least one second part of the channel, one among the first or the second gates additionally containing a stack of layers 143, of which at least one of the said layers is capable of storing electrical charges. Preferably, the first gate forms gate 130 of the control transistor and the second gate forms control gate 140 of the memory transistor.

Preferably, the memory cell additionally has at least one portion of a second lateral spacer disposed against at least one lateral sidewall of a block 157 disposed on the semiconductor layer, the second lateral spacer being in contact with the first lateral spacer, the two lateral spacers being composed of similar materials, the said portion of the second lateral spacer forming at least part of a contact dot.

Optionally, in this example, a portion 156 is connected electrically to the second gate. This portion 156 is disposed against two lateral sidewalls of the first gate that are separate and perpendicular relative to one another. The electrical contact dot, or surface for definition of a contact area, is formed here by this portion of spacer 156 and the portion of spacer 155 formed against block 157, and it is disposed in the continuation of the first gate. Such an alternative embodiment has in particular the advantage that it can approach the electrically conductive lines intended to be formed to contact the first gate and the second gate, in this way making it possible to increase the density of a memory device formed from a matrix of memory cells.

This double-gate electronic memory cell makes it possible to achieve definition of an electrical contact area for each of the gates with a reduced risk of short circuit between the gates. This structure makes it possible to relax the constraints associated with the alignment of electrical contacts compared with the gates of the memory cell, and without having to employ a supplementary photolithography level dedicated to this definition of an electrical contact area.

However, it has been proved that, in practice, the definition of a contact area for this type of cell is really facilitated and the risks of short circuits are significantly reduced only if a rounded or substantially plane shape of the spacer can be obtained, as in the example of FIG. 1b.

The method according to the invention, a particular example of which is described with reference to FIGS. 2a to 3f, makes it possible to obtain this type of shape. The invention therefore makes it possible considerably to facilitate the definition of a contact area, and this for varied structures of memory cells, in the structure described hereinabove, an example of which is illustrated in FIG. 4, not being limitative of the invention. The method according to the present invention, applied to a memory cell having a structure such as described in the paragraphs containing reference to FIG. 4, makes it possible to achieve particularly advantageous results.

The invention is not limited to merely the exemplary embodiments described in the foregoing, and extends to any embodiment in conformity with its spirit.

In particular, the invention is not limited to one layer 210 of polycrystalline silicon and/or to one layer 220 of polycrystalline silicon. These layers may also be constituted of any other semiconductor material or of a stack of layers comprising a semiconductor material.

In view of the foregoing description, it is therefore clearly apparent that the present invention makes it possible to obtain a double-gate electronic memory cell making it possible to define an electrical contact area for each of the gates without necessitating very precise alignment of the electrical contacts relative to the gates, and limiting the risk of short circuit between the latter.

The invention claimed is:

1. A method of making a non-volatile double-gate memory cell comprising a control transistor comprising a gate and a memory transistor comprising a control gate adjacent to the gate of the control transistor, wherein the method comprises the steps of:

forming at least partly the gate of the control transistor, comprising obtaining a relief of a semiconductor material on a substrate;

forming the control gate of the memory transistor, comprising the steps of:

forming on at least one sidewall of the relief of a semiconductor material and at least one part of the substrate of a stack of layers configured to store electrical charges;

depositing a first layer of a semiconductor material so as to at least cover the stack of layers;

etching of the first layer so as to form a first pattern, juxtaposed on the relief of a semiconductor material of the gate of the control transistor;

wherein said forming of the control gate of the memory transistor additionally comprises the following steps of:

forming a second layer of a semiconductor material, at least on the first pattern;

etching of the second layer so as to form on the first pattern a second pattern having a substantially plane upper face configured to permit defining a contact area on the control gate of the memory transistor.

2. A method according to claim 1, wherein the cross section of the first pattern has a substantially triangular shape, the two adjacent sides of which are respectively turned toward the gate of the control transistor and toward the substrate.

3. A method according to claim 1, wherein the cross section of the second pattern has substantially parallelepiped shape, one side of the parallelepiped forming the substantially plane upper face.

4. A method according to claim 1, comprising a step of adapting the thickness of the second layer as a function of an upper angle formed by the cross section of the first pattern so as to adjust the width of the substantially plane upper face.

5. A method according to claim 1, wherein the etching of the first layer comprises a first anisotropic etching directed perpendicular to a plane of the substrate to leave in place a residual layer on the sidewalls of the relief.

6. A method according to claim 5, comprising, after the first anisotropic etching, a second selective isotropic etching, with stopping of the etching on the stack of layers.

7. A method according to claim 1, wherein the etching of the second layer comprises a first anisotropic etching directed perpendicular to a plane of the substrate to leave in place a residual layer on the first pattern.

8. A method according to claim 7, comprising, after the first anisotropic etching, a second selective isotropic etching, with stopping of the etching on the stack of layers.

9. A method according to claim 1, wherein the formation of the second layer is achieved so that its thickness is constant over the entire deposited surface.

10. A method according to claim 1, wherein the thickness of the deposit of the second layer is between one quarter and two times the thickness of the relief of a semiconductor material of the gate of the control transistor.

11. A method according to claim 10, wherein the thickness of the deposit of the second layer is between one third and one times the thickness of the relief of a semiconductor material of the gate of the control transistor.

12. A method according to claim 11, wherein the thickness of the deposit of the second layer is approximately equal to half the thickness of the relief of the gate of the control transistor.

13. A method according to claim 1, wherein the thickness of the deposit of the first layer is at least equal to one quarter of the thickness of the relief of a semiconductor material of the gate of the control transistor.

14. A method according to claim 13, wherein the thickness of the deposit of the first layer is approximately equal to the thickness of the relief of a semiconductor material of the gate of the control transistor.

15. A method according to claim 1, comprising at least one sequence of steps performed at the end of etching of the second layer, each sequence comprising at least the deposition of an additional layer of a material similar to that of the second layer then anisotropic etching of this additional layer.

16. A method according to claim 15, comprising at least two sequences.

17. A method according to claim 1, wherein the at least partial forming of the gate of the control transistor comprises, prior to depositing the first layer, forming a sacrificial layer above the relief of a semiconductor material, the method also comprising a step of stripping of the sacrificial layer, carried out subsequent to the step of etching of the second layer, so as to generate a difference of level between the upper face of the second pattern and the upper end of the relief of a semiconductor material.

18. A method according to claim 1, wherein the control gate of the memory transistor forms a spacer for the gate of the control transistor.

19. A method according to claim 1, wherein forming the control gate of the memory transistor is carried out so that the control gate of the memory transistor is self-aligned with the gate of the control transistor.

20. A method according to claim 1, wherein the semiconductor material of the first layer is of polycrystalline silicon and wherein the semiconductor material of the second layer is also of polycrystalline silicon.

21. A method according to claim 1, wherein the stack of layers comprises two layers of electrical insulator fitting around an intermediate layer for trapping of charges.

22. A method according to claim 1, comprising a step of covering the second pattern by at least one additional layer of high temperature oxide and preferably by an additional layer of silicon nitride, as well as a step of partial stripping of the additional layer, so as to leave the substantially plane upper face free in part at least.

23. A method according to claim 1, comprising a step of silicidation of the substantially plane upper face.

24. A non-volatile double-gate memory cell comprising:
a control transistor comprising a gate and a memory transistor comprising a control gate adjacent to the gate of the control transistor, the gate of the control transistor comprising a relief of a semiconductor material on a substrate and the control gate of the memory transistor comprising:
a stack of layers formed on at least one sidewall of the relief of the semiconductor material of the gate of the control transistor and at least one part of the substrate and configured to store electrical charges,
a first pattern of a semiconductor material disposed on the stack of layers and having a substantially triangular section, the first pattern being formed by depositing a first layer of a semiconductor material so as to at least cover the stack of layers, and etching of the first layer so as to form the first pattern juxtaposed on the relief of a semiconductor material of the gate of the control transistor,
wherein the control gate of the memory transistor additionally comprises a second pattern of a semiconductor material disposed on the first pattern and configured to have a substantially plane upper face configured to permit defining a contact area on the control gate of the memory transistor, the second pattern being formed by forming a second layer of a semiconductor material, at least on the first pattern, and etching the second layer so as to form on the first pattern the second pattern.

* * * * *